(12) United States Patent
Hawkins et al.

(10) Patent No.: US 6,211,916 B1
(45) Date of Patent: Apr. 3, 2001

(54) SOLID STATE IMAGER WITH INORGANIC LENS ARRAY

(75) Inventors: Gilbert Alan Hawkins, Mendon; David Newell Nichols; David Lawrence Losee, both of Fairport; Robert Leroy Nielsen, Pittsford, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 08/627,844

(22) Filed: Mar. 11, 1996

(51) Int. Cl.⁷ ............... H04N 5/225; G03B 3/00
(52) U.S. Cl. ............... 348/340; 359/619
(58) Field of Search ............... 348/340, 342, 348/301, 308, 272, 273, 280; 250/208.1, 216; 359/619, 620

(56) References Cited

U.S. PATENT DOCUMENTS

| | | | |
|---|---|---|---|
| 4,553,153 | 11/1985 | McColgin et al. | 357/30 |
| 4,667,092 * | 5/1987 | Ishihara | 250/216 |
| 4,694,185 | 9/1987 | Weiss | 250/578 |
| 4,966,831 | 10/1990 | Mehra et al. | 430/321 |
| 5,293,267 | 3/1994 | Nakai | 359/619 |
| 5,306,926 | 4/1994 | Yonemoto | 257/432 |
| 5,321,249 * | 6/1994 | Nomura | 250/208 |
| 5,321,297 | 6/1994 | Enomoto | 257/432 |
| 5,324,930 | 6/1994 | Jech, Jr. | 250/216 |
| 5,371,397 | 12/1994 | Maegawa et al. | 257/432 |
| 5,505,804 * | 4/1996 | Mizuguchi et al. | 359/620 |

OTHER PUBLICATIONS

"A New Planarization Technique, Using a Combination of RIE and Chemical Mechanical Polishing (CMP)", IEDM Technical Digest. 1989. IEEE. By B. Davari et al.*

* cited by examiner

*Primary Examiner*—Wendy R. Garber
*Assistant Examiner*—Alicea M Harrington
(74) *Attorney, Agent, or Firm*—Raymond L. Owens

(57) ABSTRACT

An imager, including: a semiconductor substrate; a plurality of spaced image pixels formed in the substrate; and a dielectric layer formed over the image pixels, the dielectric layer having a top surface. The imager further includes a plurality of depressions formed in the top surface; and a plurality of lenses having top surfaces, each lens formed in the depression corresponding to an underlying image pixel, the top surface of each lens being optically planar with the top surface of the dielectric.

8 Claims, 10 Drawing Sheets

SOLID STATE IMAGER WITH INORGANIC LENS ARRAY

CROSS-REFERENCE TO RELATED APPLICATIONS

Reference is made to commonly assigned and concurrently filed U.S. application Ser. No. 08/613,877, entitled "Method for Forming Inorganic Lens Array for Solid State Imagers", by Hawkins et al; U.S. application Ser. No. 08/613,930, entitled "Solid State Imager with Cross Cylindrical Lens Array", by Hawkins et al, and U.S. application Ser. No. 08/613,306, entitled "Method for Forming Cylindrical Lens Arrays for Solid State Imager", by Hawkins et al, the disclosures of which are incorporated herein by reference.

FIELD OF THE INVENTION

This invention relates to solid state imagers with integral lens arrays, and more particularly to imagers having planar lens arrays formed from one or more layers of inorganic materials.

BACKGROUND OF THE INVENTION

A solid state imager can be viewed as being made up of a number of laterally offset pixels containing photosensitive regions. Lens arrays placed in registration with the pixels of a solid state imager are well known to the art and can take a variety of forms. Each lens concentrates incident light into an associated pixel of the imager in order to optimize device performance by increasing light sensitivity. Interline imagers, in which the photosensitive region (photodiode) occupies only part of each pixel, particularly benefit from lens arrays, as is well known in the art. FIG. 1 shows a single pixel 10 of a typical prior art interline imager in registration with a lens 22, a photodiode 14 formed in a semiconductor substrate 12, a gate electrode 16, and a light shield 18. The gate electrode 16 and the light shield 18 are typically isolated electrically from one another and from the semiconductor substrate 12 by isolation oxides, not shown. A lens array includes a plurality of lenses 22. The photodiode 14, the semiconductor substrate 12, the gate electrode 16, and the light shield 18 form a semiconductor portion 40 of the imager.

Lens arrays integral to the imager are commonly made by thermal deformation of photolithographically defined polymers, such as photoresist, as taught for example by Ishihara, U.S. Pat. No. 4,667,092 for the case of cylindrically shaped lens arrays, or Weiss, U.S. Pat. No. 4,694,185 for the case of rectangular lens arrays.

Referring again to FIG. 1, the device shown has a lens supporting layer 20 for offsetting the lens array from the photodiode 14 to maximize collection of light in the photodiode 14. Conventionally, the lens supporting layer 20 includes at least one organic or inorganic spacer layer to achieve some degree of planarization. A blocked light ray 30 that is not collected by the photodiode 14 is shown. Referring now to FIGS. 2A and 2B, the lens supporting layer 20 can include an upper spacer layer 20a and a lower spacer layer 20b. A color filter element 26, as shown in FIG. 2B, can be positioned between the upper spacer layer 20a and the lower spacer layer 20b for the manufacture of color imagers and can thus also be part of the lens supporting layer 20. The use and limitations of such planarization layers in optically active solid state devices is taught by McColgin, U.S. Pat. No. 4,553,153 for a polymerizable monomer. Color filter arrays, such as those described in Nomura, U.S. Pat. No. 5,321,249, are also typically coated from organic materials.

Referring again to FIGS. 2A and 2B, to form a lens array over the lens supporting layer 20, a coating, typically of photoresist, is exposed on the lens supporting layer 20 and developed to produce an array of rectangular resist islands 28. The resist pattern is then flood exposed to bleach the remaining photochemistry and subsequently heated until the resist material flows enough to form the convex lenses 22, yet not so much as to cause adjacent lenses to flow together, as taught in U.S. Pat. No. 4,694,185. Therefore, there must be some spacing between the lenses 22, and as a result, some light is lost.

To fully utilize the available light, all incident light rays desired to be associated with a given pixel must be directed through the associated aperture 24 in the light shield 18 and into or near the photodiode 14. Because the opening of the aperture 24 is typically made small in order to reduce smear, as is well known in the art, and because of the need for spacing between the lenses 22 as previously noted, it has not been possible to direct all light rays to the photodiode 14. Moreover, the apertures 24 in the light shields 18 are frequently rectangular in shape when viewed from above the imager, whereas the lenses 22 are frequently square, when viewed from above the imager, further reducing the number of rays directed to the photodiode 14. Therefore, the sensitivity of the imager is reduced to less than what it might otherwise be.

Various improvements in the structure of the lens array have been directed to increasing the light gathering efficiency by directing a greater portion of the rays into the photodiode 14. Enomoto, U.S. Pat. No. 5,321,297, and Nakai, U.S. Pat. No. 5,293,267, teach methods of forming lenses having different curvatures in the directions corresponding to the long and short dimensions of the apertures, thereby increasing the fraction of incident rays directed toward the photodiode. Yonemoto, U.S. Pat. No. 5,306,926, teaches the use of spacer layers and planarizing layers using materials with indices of refraction that assist the direction of rays to the photodiodes. Masegawa, U.S. Pat. No. 5,371,397, shows a variety of light beam dispersion structures, as well as the use of layers having deliberately adjusted indices of refraction to better collimate rays entering the photodiode, thereby reducing smear. Other improvement efforts have been directed to reducing or utilizing the space between the lenses. For example, Jech, U.S. Pat. No. 5,324,930, laterally offsets the lens array with respect to photodiodes so that some light falling in the gap between the lenses can be utilized. Revelli et al., commonly assigned U.S. application Ser. No. 08/369,235 filed Jan. 6, 1995, discloses techniques for making lenses with smaller gaps.

Despite these improvements, it is still not possible to direct all incident rays through the apertures 24 and into the photodiodes 14, and thus increased sensitivity of the imagers is still required. This is particularly the case for small pixels, due to the small size of the apertures 24 and to the comparatively larger fraction of area of the lens array occupied by the gaps between the lenses 22. Furthermore, the art has encountered difficulties in stability of the organic materials, which must be subjected to temperatures sufficient to flow the material, but which must remain substantially transparent. Mehra et al., U.S. Pat. No. 4,966,831, teaches methods of protecting the lenses from oxidation, but these methods require additional fabrication steps.

A further difficulty encountered in the art is that the choice of indices of common polymeric lens materials is limited to values not too different than that of glass, thereby making overcoating of the lenses with polymeric materials for protection and for packaging difficult, since the refraction of light rays depends on the difference of the indices of the materials at the lens surface. In addition, as typically practiced, the upper lens surfaces are not conducive to further device processing because they are not planar, and therefore, not optimal for subsequent photolithography.

Yet another difficulty encountered in the art is that polymeric lens materials cannot be heated excessively, for example, to temperatures common in device testing or in instrument sterilization, without changes in lens shape or optical absorption. U.S. Pat. No. 5,321,297 teaches the transfer of the shape of a polymeric lens array fabricated on an inorganic lens layer to that layer by means of an isotropic etch having the same etch rate for the polymeric lens array material as for the inorganic lens layer material. While this method can produce lens arrays that can be heated and for which the selection of material with a wider range of optical properties is possible, the etch is difficult to control in practice and is not widely used in the art. In addition, this method does not solve the loss of optical collection efficiency due to gaps between lenses.

Finally, the methods currently practiced suffer difficulty in process control for devices of different sizes and suffer some loss of optical efficiency because the methods of achieving planarity are imperfect The shape of upper and lower spacer layers 20a and 20b and color filter elements 26 in FIGS. 2A and 2B is difficult to control because of the topography of electrodes 16 and light shields 18 especially using a common process for devices of different lateral sizes.

SUMMARY OF THE INVENTION

Accordingly, it is an object of this invention to provide lens arrays for solid state imagers in which an increased fraction of rays are directed to the photodiodes.

This object is achieved by an imager, comprising:
(a) a semiconductor substrate;
(b) a plurality of depressions formed in the top surface;
(c) a dielectric layer formed over the image pixels, the dielectric layer having a top surface; and
(d) a plurality of depressions formed in the top surface; and
(e) a plurality of lenses having top surfaces, each lens formed in the depression corresponding to an underlying pixel, the top surface of each lens being optically planar with the top surface of the substrate.

ADVANTAGES

An imager according to this invention provides an imager with increased device sensitivity by increasing the fraction of incident rays directed to the photodiodes.

An imager according to this invention provides an imager in which a broad range of materials can be selected so that layers other than air may be present over the top surface of the lens array. The materials can be chosen so as to be resistant to heat treatments during and after device fabrication.

An imager according to this invention further provides an imager in which the loss of light is reduced by controlling or eliminating the gaps between the lenses.

An imager according to this invention further provides an imager in which the shape of at least some of the lenses can be controlled to a greater degree than the control provided by thermal reflow.

DETAILED DESCRIPTION OF THE PREFERRED EMBODIMENTS

Figure 1:
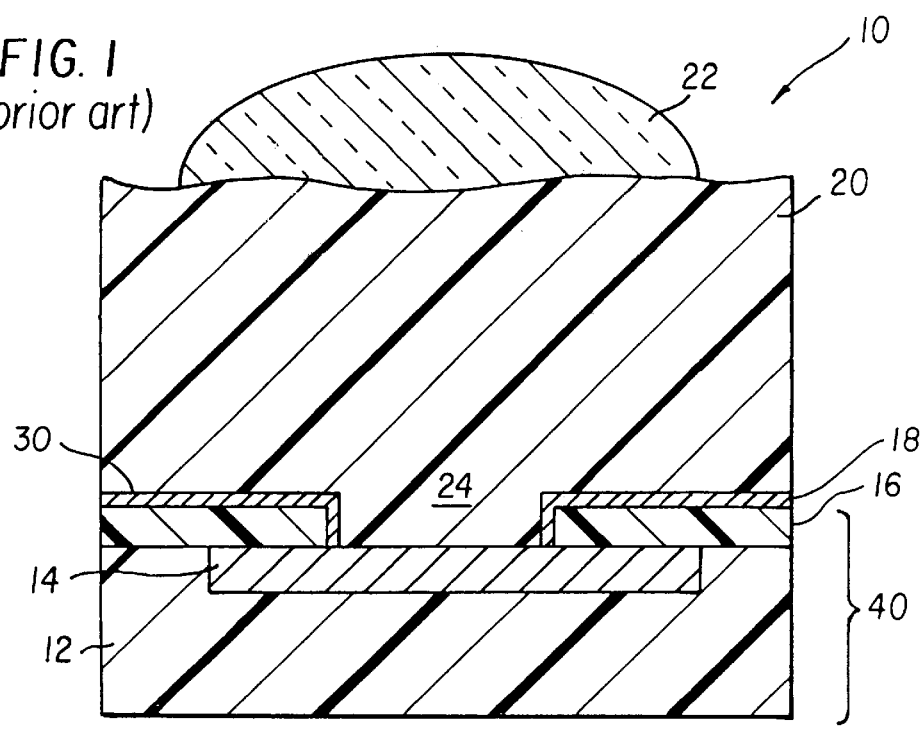
FIG. 1 is a partial schematic cross-sectional view of a prior art imager.
Figure 2A:
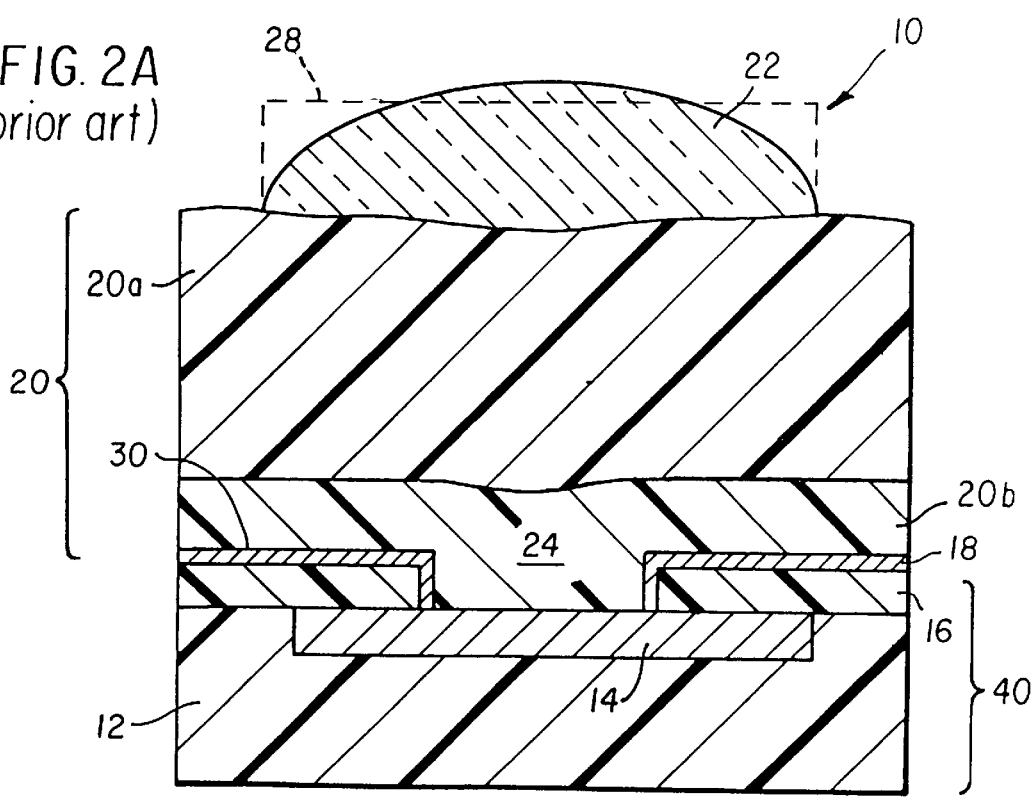
FIGS. 2A and 2B are partial schematic cross-sectional views of a prior art imager having upper and lower spacer layers.
Figure 2B:
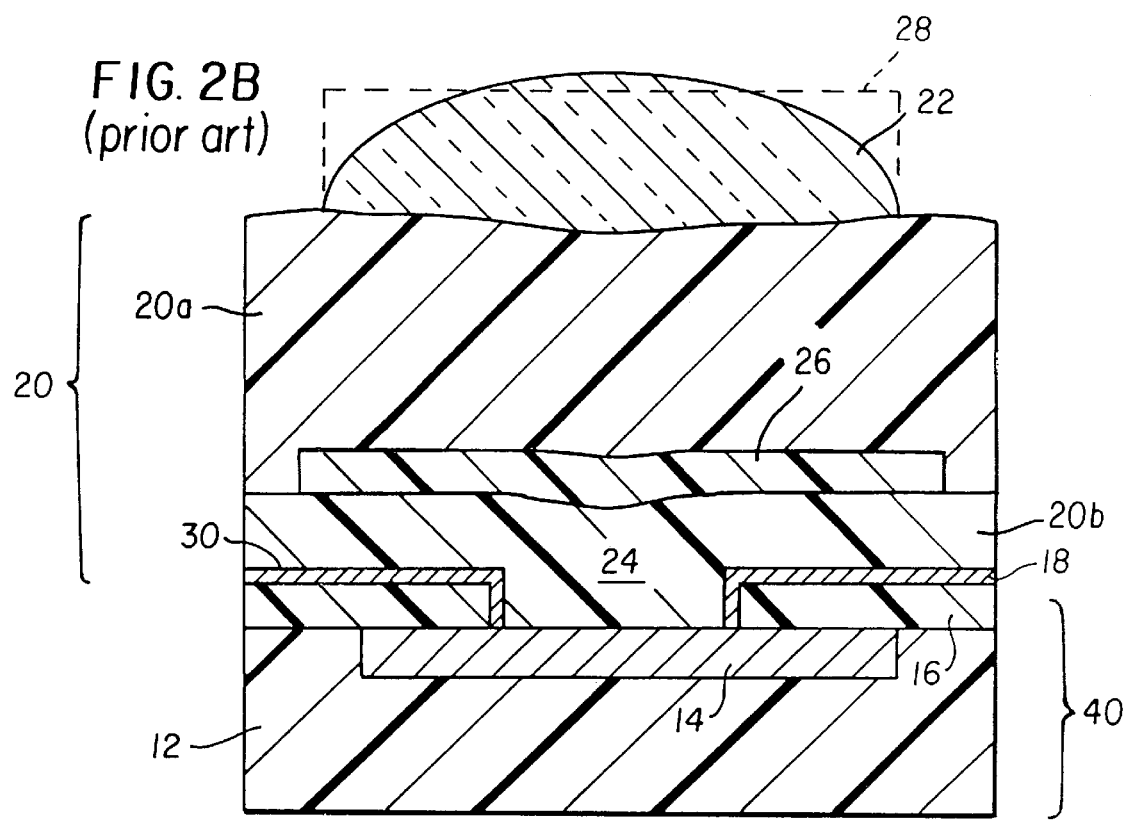
Figure 3A:
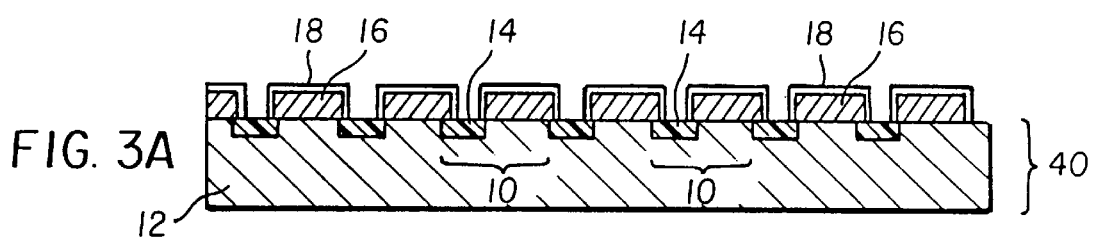
FIGS. 3A–3L are schematic cross-sectional and plan views of a solid state imager made in accordance with this invention in which the planar top surface of each lens in the lens array is coplanar with the substrate in which it is formed.

Where parts or elements correspond to FIG. 1 and FIGS. 2A and 2B, the same numerals will be used. Referring to FIGS. 3A through 3L, a first embodiment of the present invention is shown in which the top planar surface of each lens in a solid state imager is coplanar with the substrate in which it is formed. Referring to FIG. 3A, a schematic cross-sectional view of a semiconductor portion 40 of the solid state imager is shown. The semiconductor portion 40 of the solid state imager is made on a semiconductor substrate 12. Image pixel 10 includes a photodiode 14, an adjacent electrode 16, and an associated light shield 18, as is commonly practiced in the art. The photodiode 14 is the photosensitive part of the image pixel 10, toward which rays of light incident on the image pixel 10 need be directed. The topography of the electrodes 16 and the light shields 18 adequately represent the topography of a solid state imager for the purpose of discussing the method of the current invention. Other detailed features of the solid state imager, such as a gate dielectric layer, are not shown.

Figure 3B:
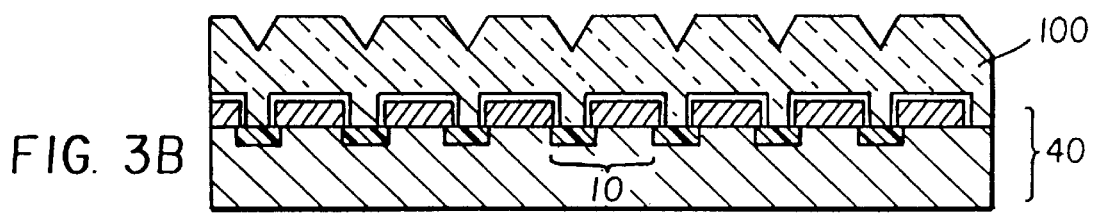
Figure 3C:
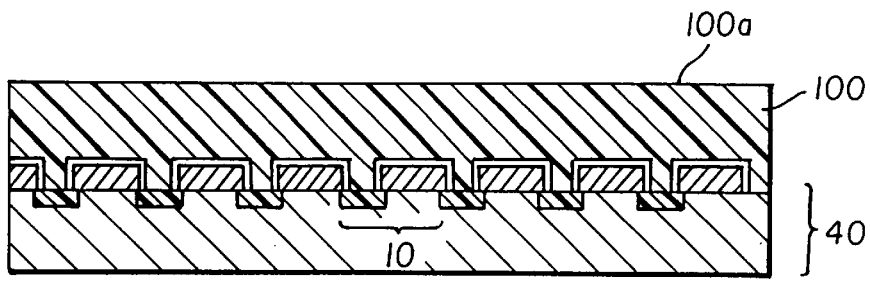

Referring now to FIG. 3B, a dielectric layer 100 is shown, preferably oxide, to provide a surface on which to subsequently form lenses. The dielectric layer 100 is deposited over the semiconductor portion 40 of the solid state imager, for example, by chemical vapor deposition (CVD) or by plasma assisted CVD. The surface of the dielectric layer 100 is then planarized, as shown in FIG. 3C, to form an optically flat surface 100a, which does not refract light incident on the photodiodes 14 other than in a manner expected of an ideal planar dielectric surface. The dielectric layer 100 is preferably planarized by chemical mechanical polishing. The dielectric layer 100 in this embodiment performs the function of a lens supporting layer, such as the prior art lens supporting layer 20 shown in FIG. 1, but is advantageously provided with the optically flat surface 100a.

Figure 3D:
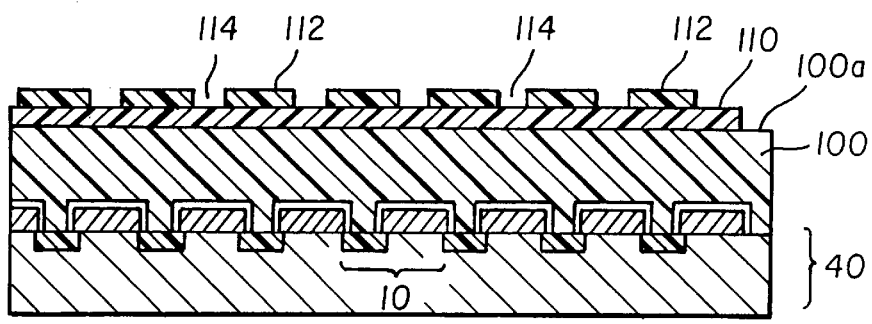
Figure 3E:
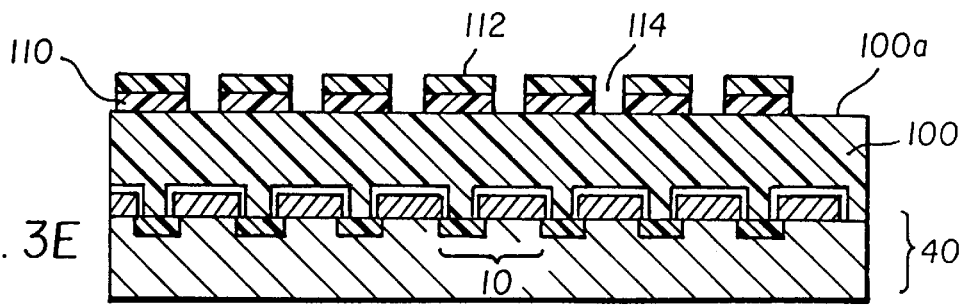

Referring now to FIG. 3D, an etch-stop layer 110 is then uniformly deposited on the optically flat surface 100a. The etch-stop layer 110 is preferably nitride. A photoresist layer 112 is then patterned with isolated openings 114 in registry with the lightshields 18 of each image pixel 10, as shown in cross-section through the centers of one row of openings 114 in FIG. 3D. The etch-stop layer 110 in the openings 114 is then removed, preferably by reactive ion etching or other methods well known to those skilled in the art. The result of the removal of the etch-stop layer 110 in the openings 114 is shown in FIG. 3E.

Figure 3F:
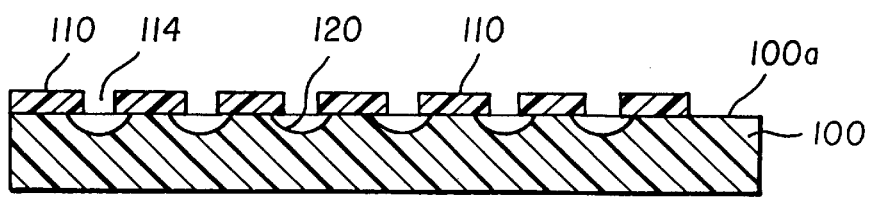

Referring now to FIGS. 3F to 3L, the semiconductor portion 40 is no longer shown, its presence in the device being understood. As shown in FIG. 3F, after the removal of the remaining portion of the photoresist layer 112, for example by oxygen plasma, the dielectric layer 100 is subjected to a substantially isotropic etch, which can be wet or dry, to provide depressions 120. Preferably, the depressions 120 do not touch one another at the optically flat surface 100a, or touch minimally, in order that the periphery of each depression 120 remain sloped at a high angle, preferably perpendicular, to the optically flat surface 100a.

Figure 3G:
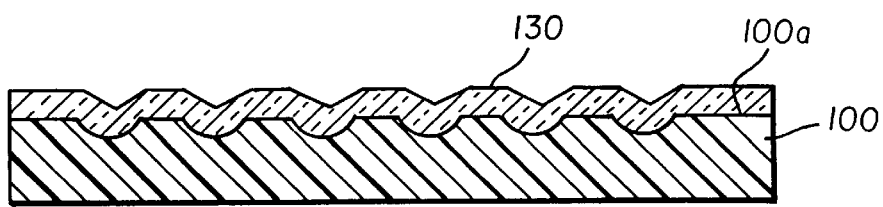
Figure 3H:
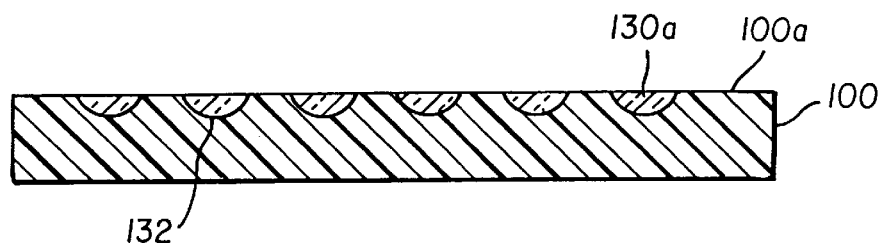
Figure 3I:
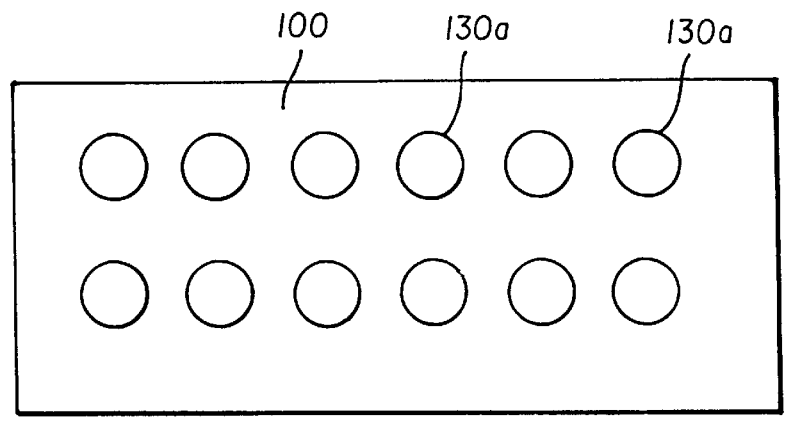

As shown in FIG. 3G, the etch-stop layer 110 is removed and a lens material 130 is formed having a refractive index higher than that of the dielectric layer 100. The lens material 130 is preferably chosen from the group silicon nitride, titanium oxide, and tantalum oxide, and can be deposited by vacuum evaporation or by application and densification of sol-gels. The top of the coating of the lens material 130 is irregularly formed at this stage. Referring to FIG. 3H, the lens material 130 is then planarized optically flat, preferably by chemical mechanical polishing, to the extent that the lens material 130 is removed from the optically flat surface 100a of the dielectric layer 100 in regions where no depressions 120 were formed, thereby forming lenses 132 having optically flat lens surfaces 130a. As shown in FIG. 3H, the optically flat lens surfaces 130a of the polished lenses 132 lie coplanar with the optically flat surfaces 100a of the dielectric layer 100. Viewed from above, as shown in FIG. 3I, the lenses 132 lie in a planar array and are spatially separated so that at least some of the optically flat surface 100a remains visible.

Figure 3J:
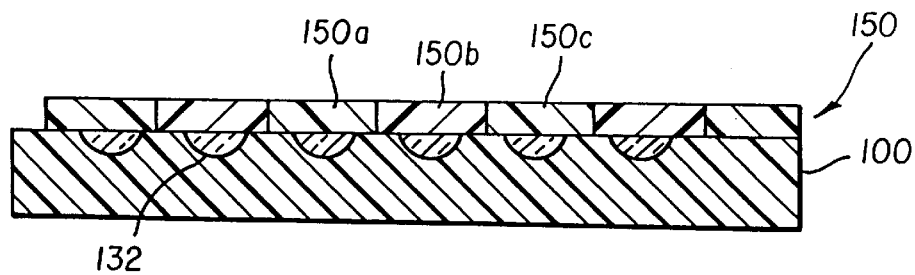

Referring now to FIG. 3J, a color filter array 150 is shown, which is formed on the optically flat surface 100a and the optically flat lens surface 130a, in registry with the lenses 132 and hence with the underlying photodiodes 14 (not shown). The color filter array 150 consists of a plurality of first, second, and third color filter elements 150a, 150b, and 150c, respectively, which transmit different portions of the visible spectrum. The process of forming the color filter array 150 is well known in the art and is taught, for example, by Nomura, U.S. Pat. No. 5,321,249, who describes a spin on coating technique on a material not containing lenses.

It is to be appreciated that the light ray refractory properties associated with the lenses 132 in accordance with the present invention are not severely reduced upon overcoating with the organic polymer materials typically used for making color filter arrays, such as, but not limited to, the color filter materials described in Nomura in the above referenced patent. This is because the use of inorganic materials to form the lenses allows a choice of the lens refractive index that is substantially higher, for example, in the range of from 1.6 to 2.4 for the group of preferred lens materials cited above, than is the choice of index afforded by organic polymers whose indices typically lie in the range of from 1.4 to 1.6, as is well known in the art. It is also to be appreciated that the planarity of the optically flat surfaces 100a of the dielectric layer 100, as well as the fact that these surfaces are insoluble, simplify the process of forming the color filter array 150. As is well known in the art, planarity of the bottom surface of color filter arrays is advantageous for uniform spectral transmission characteristics. This is not the case for the prior art, as illustrated in FIGS. 1, 2A, and 2B.

Figure 3K:
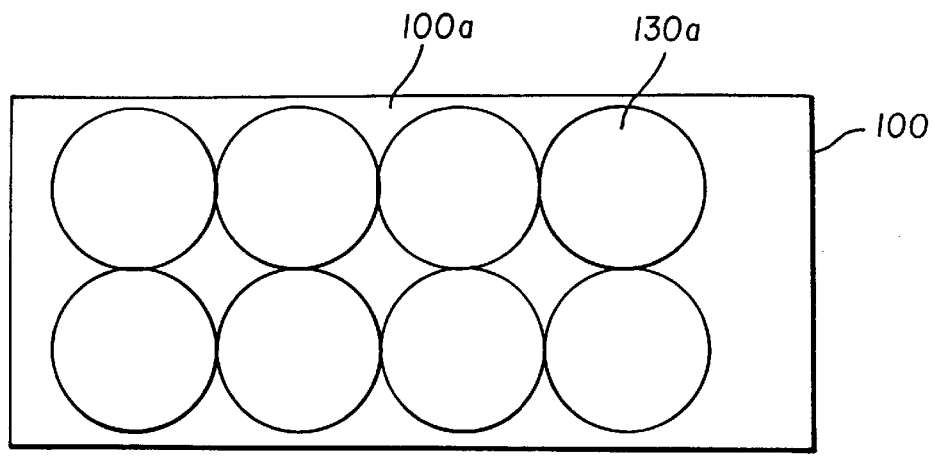
Figure 3L:
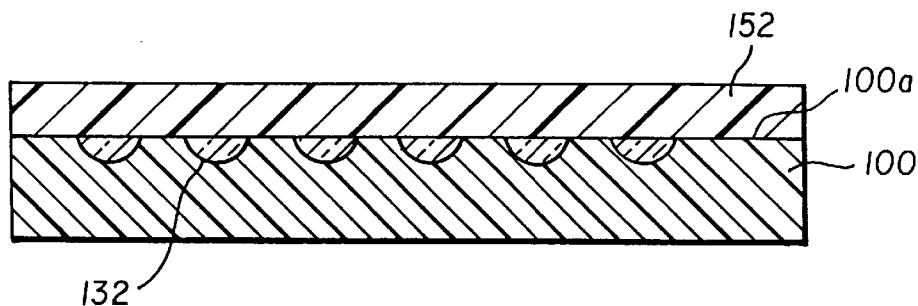

Referring now to FIG. 3K, by extending the etching time of the dielectric layer 100 until the depressions 120 are touching, the optically flat lens surfaces 130a can be caused to touch. The touching of the optically flat lens surfaces 130a provides for a larger ratio between the optically flat lens surfaces 130a and the optically flat surfaces 100a of the dielectric layer 100, while the surfaces still remain coplanar.

In a related embodiment (FIG. 3L), a substantially organic layer 152, whose refractive index is less than the refractive index of the dielectric layer 100, such as an epoxy, is provided over the optically flat lens surfaces 130a and the optically flat surfaces 100a. The substantially organic layer thereby takes the place of the color filter layer 150 of the first embodiment, (FIG. 3J). This embodiment is advantageous in packaging the imager, as is well known in the art, and is permissible without sacrificing the refractive properties of the lenses 132 because the use of inorganic materials to form the lenses 132 allows a choice of the lens refractive index that is substantially higher, for example, in the range of from 1.6 to 2.4 for the group of preferred lens materials cited above. The substantially organic layer 152 whose refractive index is less than the refractive index of the dielectric layer 100 can be placed on top of color filter layer 150 shown in FIG. 3J, the method being advantageous in packaging an imager with color filters.

Figure 4A:
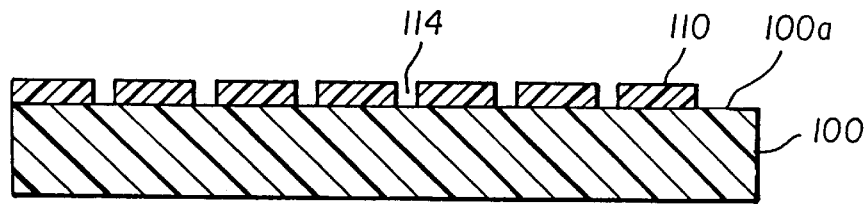
FIGS. 4A–4G are schematic cross-sectional and top views of a solid state imager made in accordance with this invention in which the curvature near the center and in the peripheral part of the lenses can be controlled.
Figure 4B:
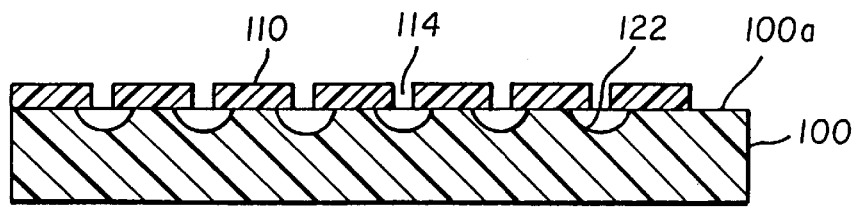
Figure 4C:
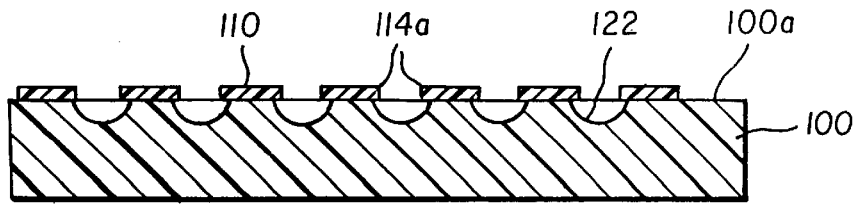
Figure 4D:
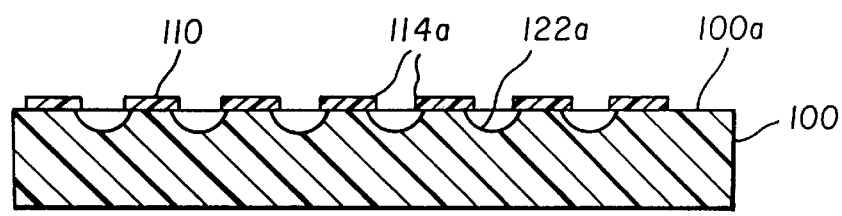

Turning now to FIGS. 4A through 4F, a second embodiment of the present invention is shown in which the method of making the shape of the depressions 120 in the dielectric layer 100 is deliberately altered by breaking the etch into several sequential steps and altering the mask shape between the steps. This embodiment provides a means of controlling both the curvature near the center and in the peripheral parts of the lenses 132. The position of the depressions 120 relative to the underlying photodiodes 14 is not changed from that of the first embodiment associated with FIGS. 3D through 3F. Referring to FIG. 4A, definition of the openings 114 in the etch-stop layer 110 in preparation for etching the dielectric layer 100 are shown to have proceeded as described in association with FIG. 3E. As shown in FIG. 4B, some etching of the dielectric layer 100 has been performed, similar to FIG. 3F, to form partially etched depressions 122. The lateral extent of the etch is insufficient for partially etched depressions 122 to touch. Referring to FIG. 4C, at this stage of fabrication, the etching of the dielectric layer 100 is interrupted and the etch-stop layer 110 is itself isotropically etched, preferably by a high pressure plasma etch process. Therefore, the size of the etch-stop layer 110 and of the openings 114 are altered, with openings 114 being expanded laterally to form first altered openings 114a. As shown in FIG. 4D, the etching of the dielectric layer 100 is then continued, forming first altered depressions 122a, with the ratio of vertical to horizontal etching of the sides of the depressions 122a now being different than the ratio would have been without formation of the first altered openings 114a. The precise change in horizontal to vertical etch ratios depends on the type and parameters of the etching process, for example, on the degree of anisotropy, on the degree to which the first altered openings 114a are altered, and on the location within the first altered depressions 122a, as is well known to those skilled in the art. In FIG. 4D, the alteration in the openings 114 is shown as creating the first altered opening 114a of horizontal size less than the horizontal size of the top of the first altered depression 122a, but this need not be the case in general.

Figure 4E:
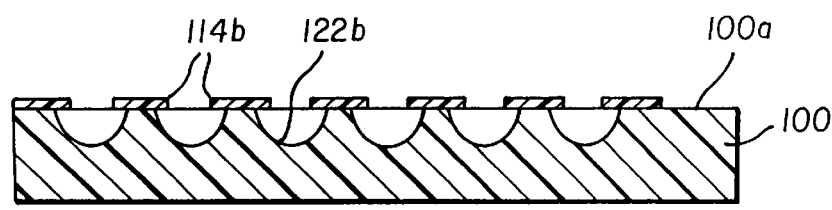
Figure 4F:
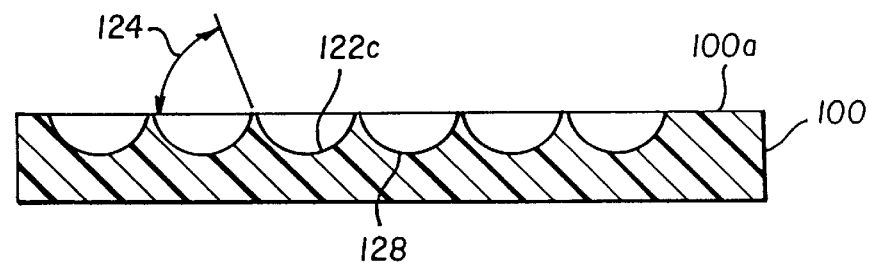
Figure 4G:
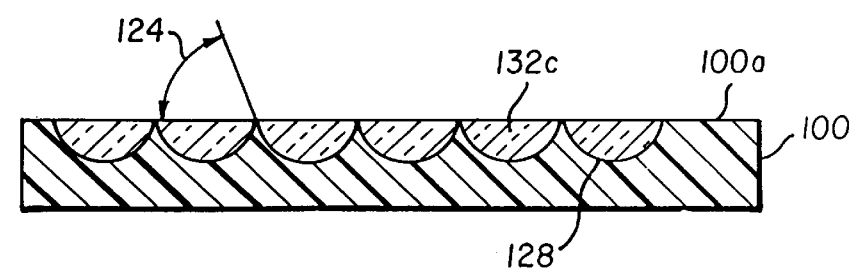

Referring now to FIG. 4E, by repeating these steps, the first altered openings 114a are again altered to form second altered openings 114b, and the first altered depressions 122a are further etched to form second altered depressions 122b. As shown in FIG. 4F, by further repeating this sequence of steps, a final depression 122c is provided having an angle 124 formed by the edge of the final depression 122c and the optically flat surface 100a of the dielectric layer 100 that is smaller than would otherwise have been provided by using the opening 114 of constant size, as in the first embodiment discussed in association with FIG. 3. Lenses 132c are then formed (FIG. 4G) in depressions 122c in a manner identical to that discussed in association with FIGS. 3G and 3H. In particular, the shape of the final depression 122c is no longer substantially spherical, as is the case for the opening 114 of constant size. A spherical depression 120 in accordance with the first embodiment is particularly achieved when the opening 114 is small compared to the lateral extent of the depressions 120 and when the etch is isotropic. The angle 124 (FIG. 4E), as well as the shape of the final depression 122c along its entire interface 128 (FIG. 4F) with the dielectric layer 100 is critical in determining the number of incident rays directed to the photodiode 14 in the semiconductor substrate 12. The ability to control the distribution of curvature over the interface 128 is advantageous in maximizing the number of such rays, as is well known in the art of lens design. In particular, reduction of angle 124 is advantageous in avoiding total internal reflection of incident rays at the interfacial 128 of the lenses 132c.

Referring now to FIGS. 5A to 5G, a third embodiment achieved in accordance with this invention is described, the method being initially similar to the method illustrated in FIGS. 3A–3K, but providing lenses which are substantially cylindrical and contiguous.

Figure 5A:
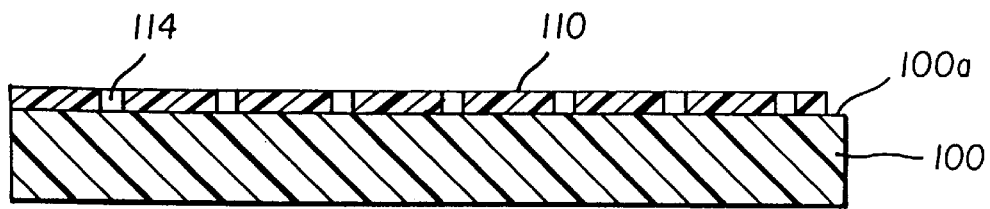
FIGS. 5A–5G are schematic cross-sectional and plan views of a solid state imager made in accordance with this invention in which the lenses are substantially cylindrical and contiguous.

FIG. 5A shows the dielectric layer 100, preferably oxide, which was previously deposited over the semiconductor portion 40 (not shown), to provide a surface on which to subsequently form lenses 132. The surface of the dielectric layer 100 has been planarized, preferably by chemical mechanical polishing, to form the optically flat surface 100a, as in FIG. 3C, which refracts light in a manner expected of an ideal planar dielectric surface. Also shown in FIG. 5A is the etch-stop layer 110, preferably nitride, deposited on the optically flat surface 100a. As shown in FIG. 5A in cross-section and in FIG. 5B in plan view, etch-stop layer 110 has been patterned using conventional photoresist (not shown) to form narrow rectangular, isolated openings 114 in etch-stop layer 110 in registry with photodiodes 14, depicted as dotted lines in FIG. 5B. FIG. 5A is a cross-section AA through the centers of one row of isolated openings 114 in FIG. 5B.

Figure 5B:
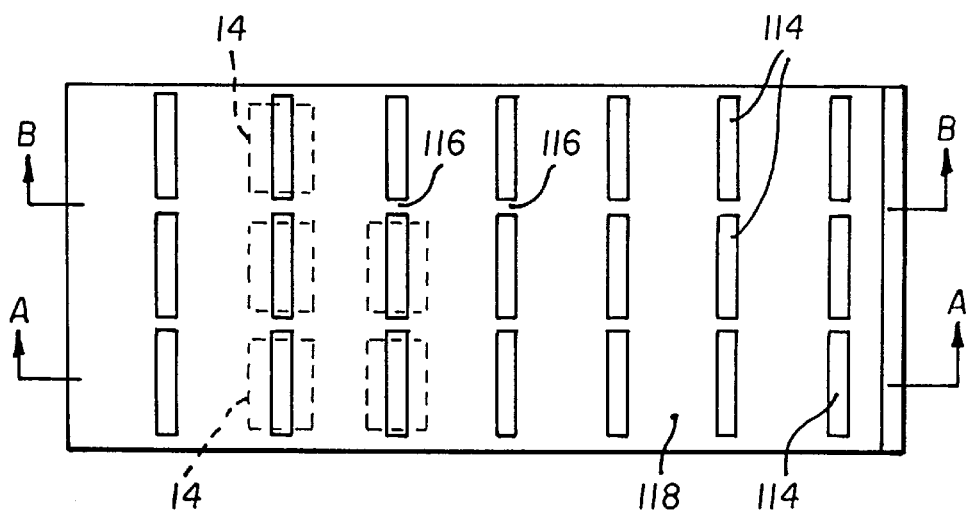

As shown in FIGS. 5A and 5B, bridge sections 116 of the etch-stop layer 110 occur between the top and the bottom of adjacent narrow rectangular openings 114. The vertical dimension at bridge section 116 is the vertical distance between the top and bottom of adjacent openings 114 and the horizontal dimension is the same as that of openings 114. The spacing between adjacent bridge sections 116 of the etch-stop layer 110 is the same as the spacing between photodiodes 14. The bridge sections 116 serve to anchor horizontally adjacent regions of the etch-stop layer 110 on either side of openings 114 during subsequent etching of the dielectric layer 100 when the etch-stop layer 110 is substantially undercut.

Figure 5C:
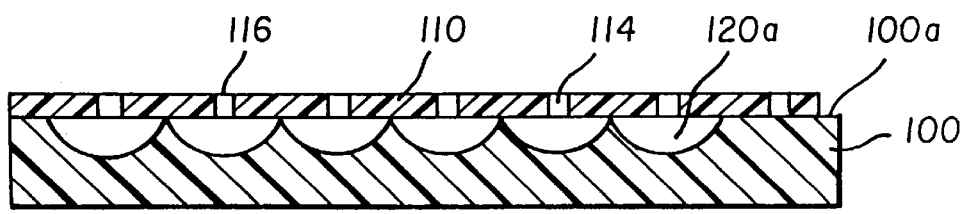

Referring to FIG. 5C, a cross-section AA of FIG. 5B is shown in which the dielectric layer 100 is next subjected to a substantially isotropic etch which may be wet or dry. The substantially isotropic etch provides depressions 120a just touching one another at the optically flat surface 100a under central regions 118 (shown in FIG. 5B) of the etch-stop layer 110, far from the bridge sections 116. Preferably, the depressions 120a will come close to touching but may not quite touch. Bridge sections 116 of the etch-stop layer 110 are undercut by the isotropic etch. Preferably, the bridge sections 116 are small enough in their vertical dimensions (FIG. 5B), for example, smaller than the horizontal dimension (FIG. 5B) of the openings 114, that the depressions 120a as viewed in cross-section BB of FIG. 4B are nearly identical to the depressions 120a as viewed in cross-section AA of FIG. 4B. This is particularly the case when the etching is allowed to proceed to the extent that the adjacent depressions 120a touch or nearly touch, which is the preferred case, as is well known in the art.

Figure 5D:
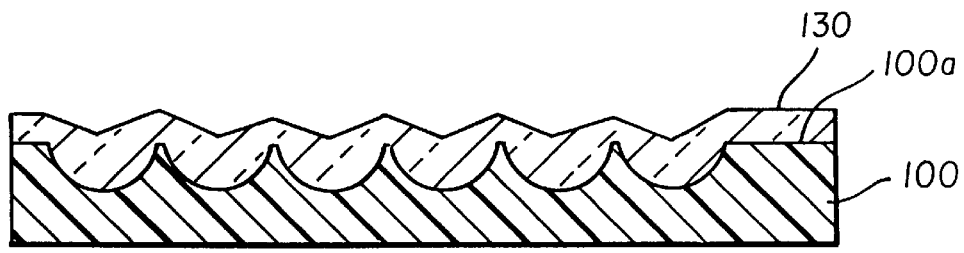
Figure 5E:
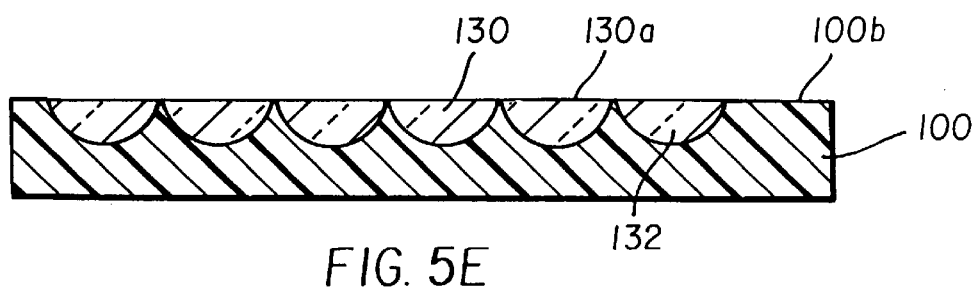
Figure 5F:
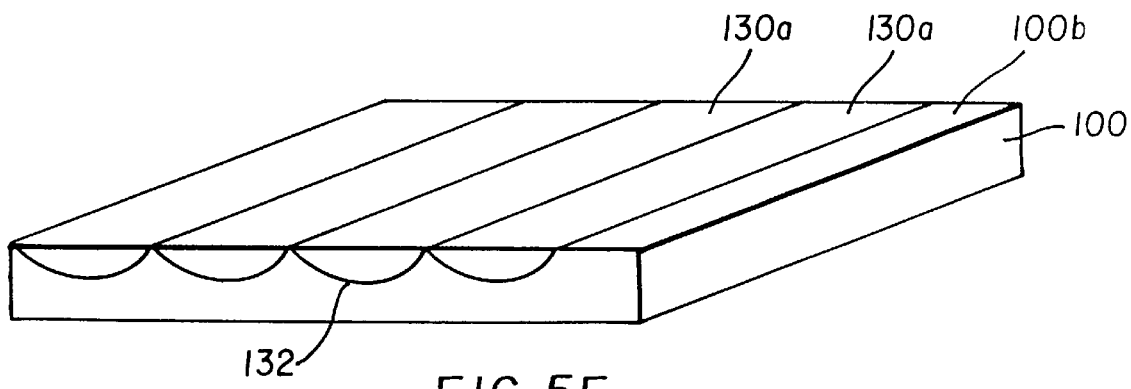

Next, as shown in FIG. 5D, the etch-stop layer 110 is removed and a lens material 130 is formed having a refractive index higher than that of the dielectric layer 100. The lens material 130 is preferably chosen from the group silicon nitride, titanium oxide, and tantalum oxide, and can be deposited by vacuum evaporation or by application and densification of sol-gels. The top of the coating of the lens material 130 is irregularly formed at this stage, as depicted in FIG. 5D. Referring now to FIG. 5E, the lens material 130 is then planarized optically flat to form optically flat lens surfaces 130a, preferably by chemical mechanical polishing, to the extent that the lens material 130 is removed from the optically flat surface 100a of the dielectric layer 100 in regions where there were no depressions 120a. Because the depressions 120a of FIG. 5C are substantially contiguous, the remaining portions of the original optically flat surface 100a can be removed, either by isotropic etching or by chemical mechanical polishing to a slight extent, to form an optically flat repolished surface 100b of the dielectric layer 100 in its place. The optically flat lens surfaces 130a of the lenses 132 then lie coplanar with the repolished surface 100b, as shown in FIG. 5E. Viewed from above, as shown in FIG. 5F, the lenses 132 lie in a planar array of half cylinders and are spatially substantially contiguous.

Figure 5G:
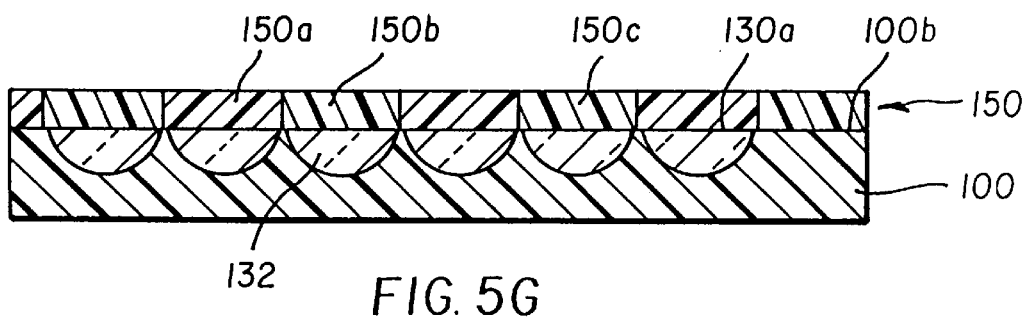

Referring now to FIG. 5G, a color filter array 150 is shown, which is formed on planar optically flat repolished lens surfaces 100b and planar optically flat lens surfaces 130a, in registry with the lenses 132, and hence the underlying photodiodes 14 (not shown). The color filter array 150 consists of first, second, and third color filter elements 150a, 150b, and 150c, respectively, which transmit different portions of the visible spectrum. The process of forming the color filter array 150 is well known in the art and is taught, for example, by Nomura, U.S. Pat. 5,321,249, who describes a spin on coating technique on a material not containing lenses. As in the second embodiment, it is to be appreciated that the light ray refractory properties associated with the lenses 132 in accordance with the present invention are not severely reduced upon overcoating with organic polymer materials, such as, but not limited to, the color filter materials described in Nomura in the above referenced patent. This is because the use of inorganic materials to form the lenses allows a choice of the lens refractive index that is substantially higher, for example, in the range of from 1.9 to 2.4 for the group of preferred lens materials cited above, than is the choice of index afforded by organic polymers whose indices typically lie in the range of from 1.4 to 1.6, as is well known in the art. It is also to be appreciated that the planarity of the optically flat surface 130a of the lenses 312 with the optically flat repolished surfaces 100b of the dielectric layer 100, as well as the fact that these surfaces are insoluble, simplify the process of forming overlying color filters and is advantageous for uniform spectral transmission characteristics of the color filter elements.

Figure 6A:
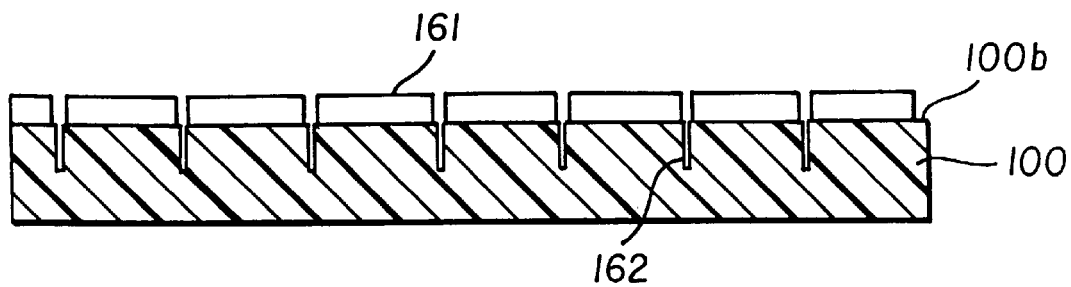
FIGS. 6A–6G are schematic cross-sectional views of a solid state imager made in accordance with this invention in which lateral etch-stops are used to assist the formation of lenses.
Figure 6B:
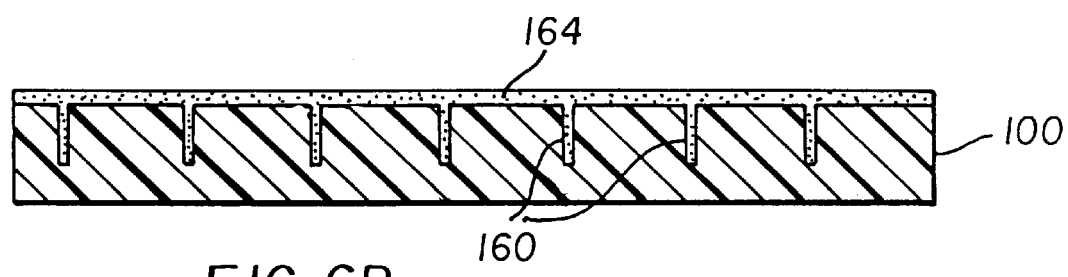

Referring now to FIGS. 6A to 6G, a fourth embodiment of the present invention is disclosed in which the etching of the dielectric layer 100, corresponding to the etching step shown in FIG. 3F which forms the depressions 120, is confined laterally by lateral etch-stops 160. FIGS. 6A and 6B show the method of providing the lateral etch-stops 160, which prevent unwanted etching in the horizontal direction. As shown in FIG. 6A, trenches 162 are formed by first patterning conventional photoresist 161 in the form of narrow openings, and then etching, preferably by reactive ion etching, the dielectric layer 100 to a depth less than the thickness of that layer. The width of the trenches 162 is preferably less than 0.2 microns.

In FIG. 6B, the formation of the lateral etch-stops 160 is shown completed by first filling the trenches 162, preferably by chemical vapor deposition of a filling material 164, preferably polysilicon or silicon nitrides, resistant to the etch for the dielectric layer 100. The dielectric layer 100 is then planarized, preferably by chemical mechanical polishing, to remove it entirely from over the optically flat surface 100a of the dielectric layer. These processes are well known in the art of semiconductor technology.

Figure 6C:
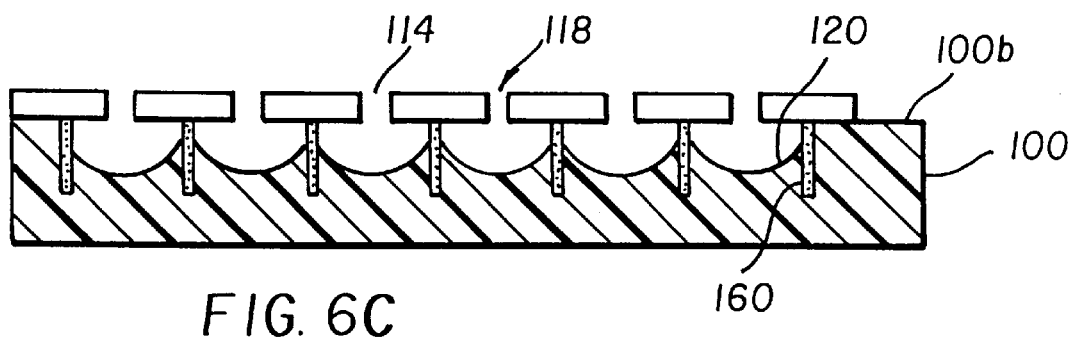
Figure 6D:
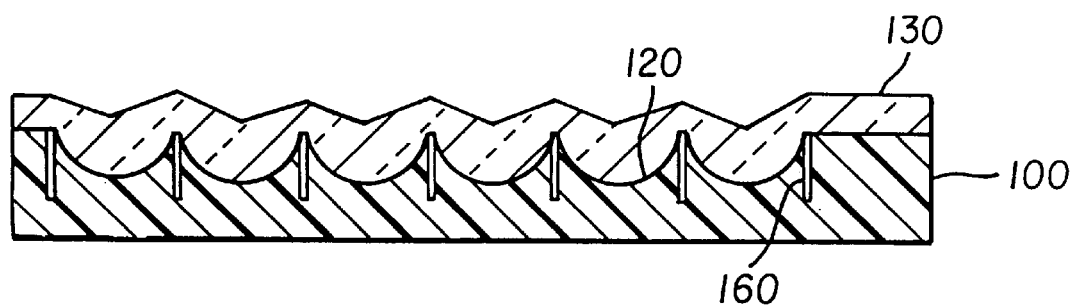
Figure 6E:
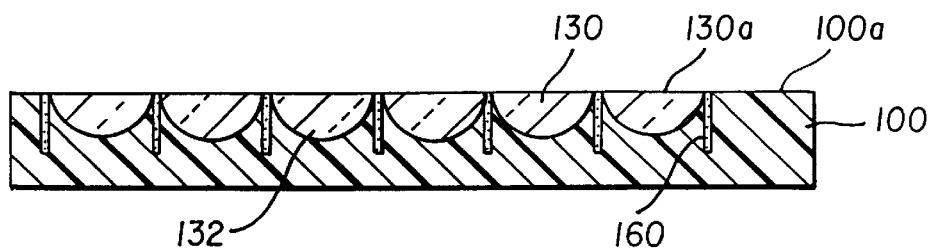

Referring to FIG. 6C, the method of forming depressions 120 in the dielectric layer 100 is then accomplished by the same series of steps discussed in association with FIGS. 3E to 3F, FIGS. 4A–4F or FIGS. 5A–5F, namely formation of openings 114 in the etch-stop layer 110, followed by isotropic etching to form depressions 120b in the dielectric layer 100. Lateral etch-stops 160 also advantageously serve to anchor etch-stop layer 110 during isotropic etching of dielectric layer 100. The extent of the etching in this embodiment must be sufficient to extend the depressions 120b at least to the sides of the lateral etch-stops 160. As shown in FIGS. 6D and 6E, corresponding to FIGS. 3G and 3H, the deposition of the lens material 130 and planarization by chemical mechanical polishing achieve a structure similar to the planar lens structure of FIG. 3G, except for the presence of the lateral etch-stops 160. In this embodiment, the lateral etch-stops 160 prevent the reduction of the slope of the lenses 132 at their peripheries and serve additionally to block unwanted light.

Figure 6F:
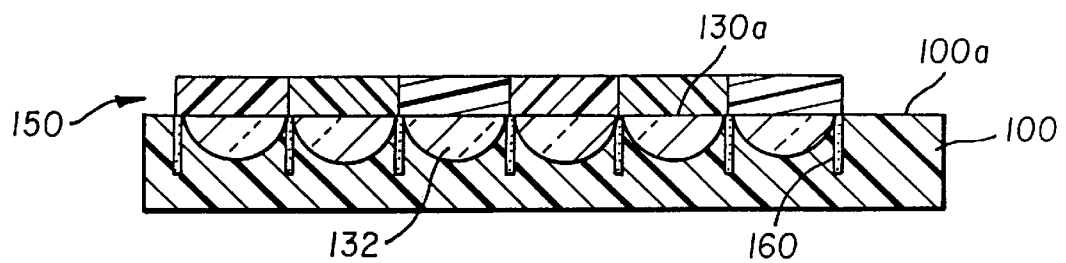
Figure 6G:
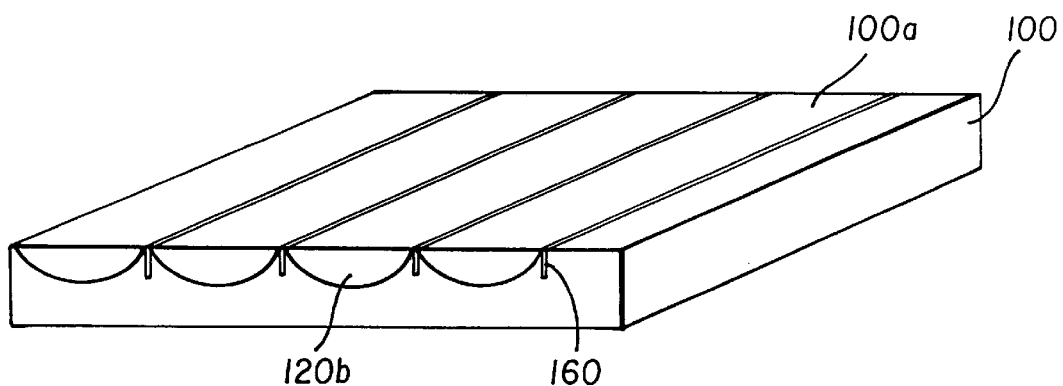

FIG. 6F illustrates the incorporation of the color filter array 150 consisting of color filter elements 150a, 150b, and 150c located on the optically flat surface 100a and the optically flat lens surface 130a. In accordance with this embodiment, as in the third embodiment, placement of the color filter array 150 above the lenses 132, rather than under the lens array as depicted in prior art FIGS. 2A and 2B, is made possible because of the high index of refraction of the lens material 130. FIG. 6G shows a three-dimensional view of FIG. 6E to illustrate the preferred orientation of etch-stops 160 and depressions 120b.

Other choices of materials are useful in the embodiments of the present invention. In particular, the trench filling material 164 may be chosen to be opaque, preferably from the set tungsten, titanium, and tantalum, and the silicide of these metals in order to prevent unwanted rays of light from crossing from one lens to another.

It is to be appreciated that the present invention has been described by reference to specific detailed embodiments and that many related variations are possible and will be obvious to those skilled in the art.

PARTS LIST 10 image pixel
12 semiconductor substrate
14 photodiode
16 electrode
18 light shield
20 lens supporting layer
20a upper spacer layer
20b lower spacer layer
22 lens
24 aperture
26 color filter element
28 resist islands
30 blocked light ray
40 semiconductor portion
100 dielectric layer
100a optically flat surface
100b optically flat repolished surface
110 etch-stop layer
112 photoresist layer
114 isolated openings
114a first altered openings
114b second altered openings
116 bridge sections
118 central regions
120 depressions
120a depressions
120b depressions
122 partially etched depressions Parts List Cont'd 122a first altered depressions
122b second altered depressions
122c final depressions
124 angle
128 interface
130 lens material
132 lens
132c lens
130a optically flat lens surface
150 color filter array
150a first color filter element
150b second color filter element
150c third color filter element
152 substantially organic layer
160 lateral etch-stop
161 photoresist
162 trench
164 filling material

What is claimed is:

1. An imager, comprising:
(a) a semiconductor substrate;
(b) a plurality of spaced image pixels formed in the substrate;
(c) a dielectric layer formed over the image pixels, the dielectric layer having a top surface;
(d) a plurality of depressions formed in the top surface; and
(e) a plurality of lenses having top surfaces, each lens formed in the depression and shaped to provide half cylinders whose lengths span a plurality of pixels, the top surface of each lens being optically planar with the top surface of the dielectric.

2. The imager of claim 1 wherein the dielectric layer is a substantially inorganic material.

3. The imager of claim 2 wherein the lens is formed of a material which includes a substantially inorganic material having an index of refraction greater than that of the substrate.

4. The imager of claim 3 further including a planarized overlayer of a material having a smaller index of refraction than the material of the lenses.

5. The imager of claim 4 wherein the planarized overlayer includes a single-layer color filter array.

6. The imager of claim 1 wherein the top surface of the dielectric layer has been made optically planar by chemical mechanical polishing.

7. The imager of claim 1 wherein the lens material is coplanar with the substrate surface.

8. The imager of claim 1 further including an array of single layer color filters directly in contact with the top surface of lenses.

* * * * *